(12) United States Patent
Vopat et al.

(10) Patent No.: US 9,214,369 B2
(45) Date of Patent: Dec. 15, 2015

(54) DYNAMIC PITCH SUBSTRATE LIFT

(71) Applicant: Varian Semiconductor Equipment Associates, Inc., Gloucester, MA (US)

(72) Inventors: Robert B. Vopat, Austin, TX (US); Jason M. Schaller, Austin, TX (US); Jeffrey Charles Blahnik, Leander, TX (US); Malcolm N. Daniel, Jr., Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 54 days.

(21) Appl. No.: 14/069,678

(22) Filed: Nov. 1, 2013

(65) Prior Publication Data

US 2015/0125240 A1    May 7, 2015

(51) Int. Cl.
*H01L 21/677* (2006.01)
*H01L 21/67* (2006.01)
*H01L 21/687* (2006.01)

(52) U.S. Cl.
CPC .... *H01L 21/67201* (2013.01); *H01L 21/67781* (2013.01); *H01L 21/68742* (2013.01)

(58) Field of Classification Search
CPC .................. H01L 21/67739; H01L 21/67745; H01L 21/67742; H01L 21/67754; H01L 21/67748; H01L 21/67781; A47B 47/022; A47B 47/027; A47B 47/028; A47B 96/025; B65G 1/026; B65G 1/0435; B65G 1/0421
USPC ................. 414/416.02, 331.16, 404
See application file for complete search history.

(56) References Cited

U.S. PATENT DOCUMENTS

| | | | | |
|---|---|---|---|---|
| 5,183,370 A * | 2/1993 | Cruz | | 414/416.03 |
| 5,273,244 A * | 12/1993 | Ono | | 248/176.3 |
| 5,297,910 A * | 3/1994 | Yoshioka et al. | | 414/226.01 |
| 5,382,128 A * | 1/1995 | Takahashi et al. | | 414/404 |
| 5,562,387 A * | 10/1996 | Ishii et al. | | 414/416.02 |
| 5,643,366 A * | 7/1997 | Somekh et al. | | 118/729 |
| 5,989,346 A * | 11/1999 | Hiroki | | 118/719 |
| 6,048,162 A * | 4/2000 | Moslehi | | 414/744.6 |
| 7,179,044 B2 * | 2/2007 | Cameron et al. | | 414/811 |
| 8,002,511 B2 * | 8/2011 | Kamikawa et al. | | 414/416.02 |
| 8,277,163 B2 * | 10/2012 | Murata et al. | | 414/282 |
| 2002/0006323 A1 * | 1/2002 | Yoshida et al. | | 414/217 |
| 2004/0197174 A1 * | 10/2004 | Van Den Berg | | 414/404 |
| 2007/0017560 A1 * | 1/2007 | Kiyota | | 134/137 |
| 2008/0014055 A1 * | 1/2008 | van der Meulen | | 414/173 |
| 2008/0159832 A1 * | 7/2008 | Mitsuyoshi | | 414/217 |
| 2011/0076117 A1 * | 3/2011 | Iizuka | | 414/217 |
| 2011/0135427 A1 * | 6/2011 | Sakaue | | 414/217 |
| 2013/0209212 A1 * | 8/2013 | Furuya et al. | | 414/788.1 |
| 2014/0056679 A1 * | 2/2014 | Yamabe et al. | | 414/749.1 |
| 2014/0210224 A1 * | 7/2014 | Hashimoto et al. | | 294/213 |
| 2015/0016935 A1 * | 1/2015 | Hashimoto et al. | | 414/744.5 |

* cited by examiner

Primary Examiner — Kaitlin Joerger

(57) ABSTRACT

An apparatus for dynamically adjusting the pitch between substrates in a substrate stack comprises first and second lift portions. The first lift portion supports a first group of the plurality of substrates, and the second lift portion supports a second group of the plurality of substrates. The first and second lift portions are operable to move the first and second groups of substrates in a first direction independently from each other. This independent movement enables the pitch, or spacing, between adjacent substrates to be dynamically adjusted so that an end effector of a robot can be positioned between such adjacent substrates to pick one of the substrates without inadvertently engaging another substrate that is not being picked. Other embodiments are disclosed.

18 Claims, 7 Drawing Sheets

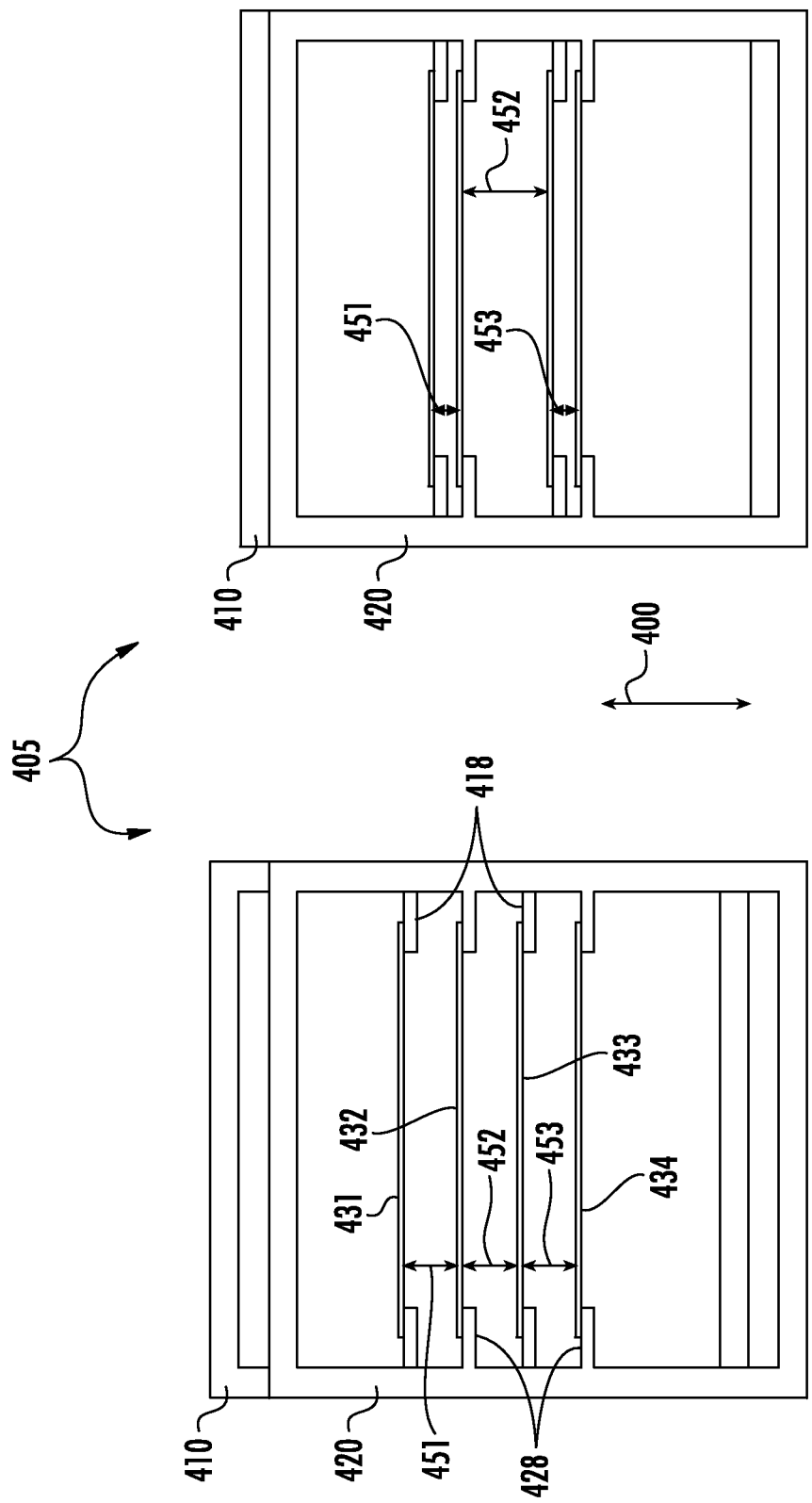

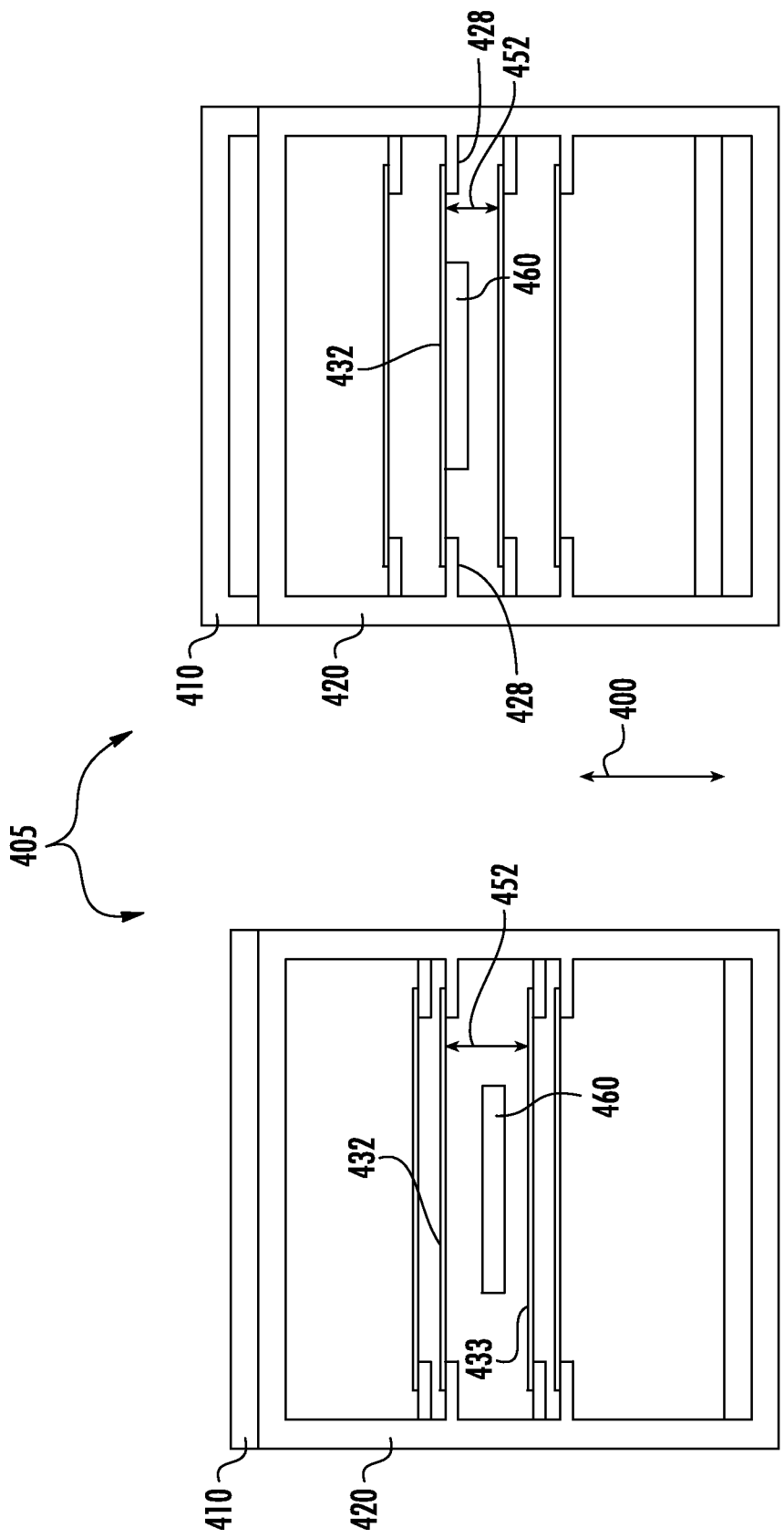

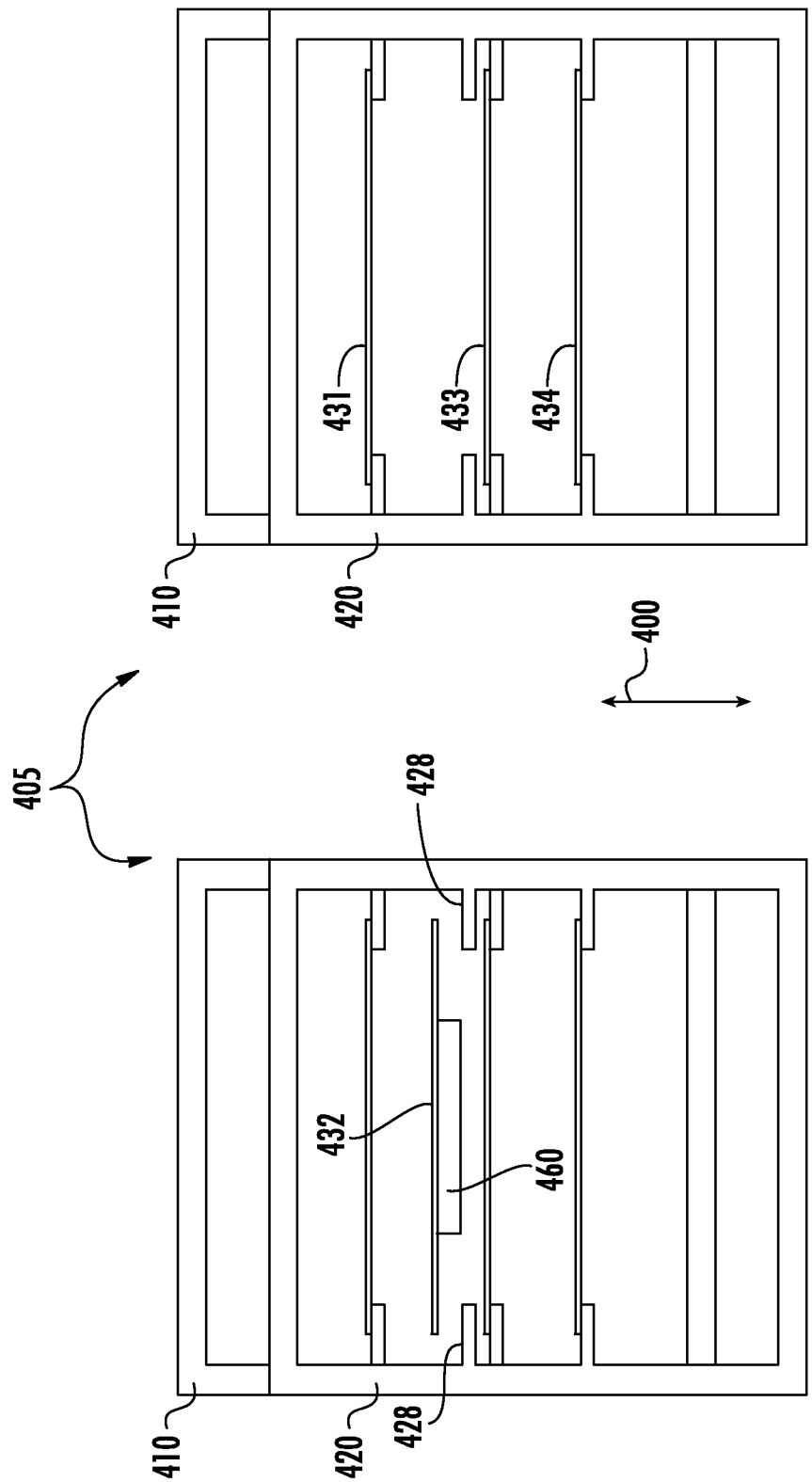

DYNAMIC PITCH SUBSTRATE LIFT

FIELD

The present embodiments relate to semiconductor substrate lifts and, more particularly, to semiconductor substrate lifts used in vacuum environments.

BACKGROUND

Semiconductor substrate processing, such as, for example, for manufacturing integrated circuits, often includes processing the substrates in a vacuum chamber. The pressure within the vacuum chamber may be adjusted (e.g., below or above atmosphere) to facilitate processing of the semiconductor substrate.

In order to maintain the vacuum chamber at a desired vacuum pressure, while transferring substrates in and out of the chamber, a load lock is often employed. For example, one or more substrates may be placed in the load lock under atmospheric conditions. The load lock may then be sealed and the pressure within the load lock may be adjusted (i.e., pumped down) to approximate the pressure in the vacuum chamber. The one or more substrates may then be retrieved from the load lock and subjected to one or more processing steps within the vacuum chamber. Moving substrates between the load lock and one or more processing platens within the vacuum chamber is often performed with the use of robotic arms, such as, for example, a selective compliance assembly robot arm (SCARA). Where multiple substrates are transferred to the load lock together they may be supported by a lift, which holds the substrates in a stacked arrangement with a gap maintained between adjacent substrates. The robot arm may be inserted into the gap between adjacent substrates to engage an individual substrate for transfer.

The size and weight of semiconductor substrates continues to increase. As will be appreciated, the robot arms used to transport these larger substrates must be able to support these heavier substrates. At the same time, size constraints within vacuum chambers may require robot arms to support these substrates over increasingly longer distances. Due to the increased weight of the substrates and longer reach requirements of the robot arms, the robot arms may droop. In some cases, this droop may be substantial and may result in contact between the robot arm and adjacent substrates as the robot arm is being inserted into the gap between substrates.

One solution is to increase the gap between substrates in the substrate lift. As will be appreciated, however, such a solution would require that the size of the load lock be increased. But increases in load lock sizes would result in longer pumping and venting times, which would undesirably increase the time for transferring substrates between vacuum and atmosphere environments, with a corresponding negative effect on throughput.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an apparatus for dynamically adjusting the pitch between substrates in a stack is described. The apparatus may include a first lift to support a first group of a plurality of substrates arranged in a stack and move the first group of substrates in a first direction, and a second lift to support a second group of the plurality of substrates and move the second group of substrates in the first direction independent of the first group of substrates, the first and second groups of substrates each including at least one of the plurality of substrates wherein the ones of the plurality of substrates in each of the first and second groups are different.

In one embodiment, a load lock for storing substrates to be processed in a vacuum chamber is described. The load lock may include a first opening for receiving a substrate stack including a plurality of substrates, a second opening for retrieving a one of the plurality of substrates, and a dynamic substrate pitch lift. The dynamic substrate lift pitch may include a first lift to support a first group of the plurality of substrates and move the first group of substrates in a first direction, and a second lift to support a second group of the plurality of substrates and move the second group of substrates in the first direction independent of the first group of substrates, the first and second groups of substrates each including at least one of the plurality of substrates wherein the ones of the plurality of substrates in each of the first and second groups are different.

In one embodiment, a method for dynamically adjusting the pitch between substrates in a substrate stack is described. The method may include supporting a first group of a plurality of substrates from a substrate stack on a first substrate lift, supporting a second group of the plurality of substrates on a second substrate lift, the first and second groups of substrates each including at least one of the plurality of substrates wherein the ones of the plurality of substrates in each of the first and second groups are different, and moving the second group of substrates in a first direction such that a pitch between one of the substrates in the second group and one of the substrates in the first group is increased.

BRIEF DESCRIPTION OF THE DRAWINGS

FIGS. 4A-4F depict one embodiment of substrate lifts for dynamically adjusting the pitch between substrates in a substrate stack.

DETAILED DESCRIPTION

Figure 1:
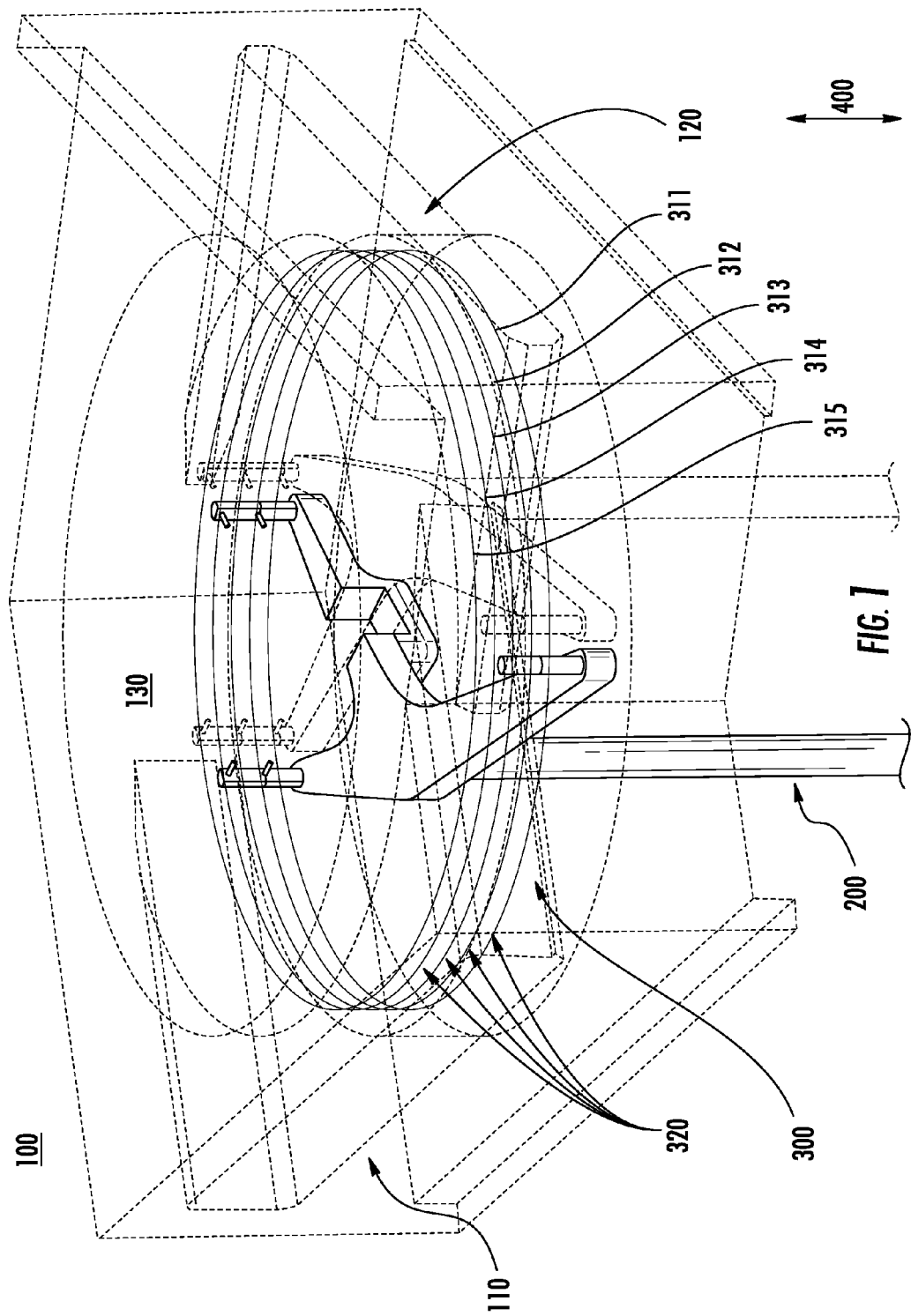
FIG. 1 is a transparent isometric view of a load lock including an exemplary dynamic pitch substrate lift according to the disclosure.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the need to move larger and/or heavier substrates from a stack of substrates in a load lock to a vacuum chamber, a dynamic pitch substrate lift is provided. In some examples, a lift, which provides for dynamically adjusting the gap between substrates in a substrate stack, is provided. As such, substrates separated by a gap may be placed in a locking dock. The gap between two of the substrates in the stack may then be dynamically adjusted to provide for desired clearance to transport one of the substrates between the load lock and a vacuum chamber.

FIG. 1 is a schematic diagram illustrating an example load lock 100 including a dynamic pitch substrate lift 200. As depicted, the load lock 100 includes a first opening 110 which may be used to transfer one or more substrates from an atmospheric environment to the load lock. The first opening 110 may be configured to receive a substrate stack 300 which may include a plurality of substrates 311-315. Said differently, the substrate stack 300 may be inserted into the load lock 100 through the first opening 110. As depicted, the load lock includes a cavity 130 within which substrate stack 300 is received.

Each of the plurality of substrates 311-315 in the substrate stack 300 may be separated from immediately adjacent substrates by respective gaps 320. The magnitude of these gaps 320 may be referred to as the "pitch." While prior substrate transfer devices have a static pitch, the disclosed lift 200 has a dynamically adjustable pitch, as will be described more fully below.

As will be appreciated, the number of substrates in the substrate stack 300 is shown to facilitate understanding. In practice, there may be more of fewer substrates in the substrate stack. As such, the number of substrates in the stack used in the examples provided herein is not intended to be limiting. For example, some substrate processing systems are configured to process substrate stacks having 25 substrates in the stack. Accordingly, the lift 200 may be configured to support 25 substrates and dynamically adjust the pitch between ones of these 25 substrates.

The load lock 100 includes a second opening 120 through which an individual substrate (e.g., one of 311-315) from the stack 300 can be picked by a vacuum robot (not shown) and transported to an associated vacuum chamber (not shown) for processing.

Thus arranged, during operation, the substrate stack 300 can be inserted into the cavity 130 of the load lock 100 through the first opening 110. More particularly, the substrates 311-315 may be handed off from a robot arm (sometimes referred to as an atmospheric robot) to the lift 200. Once the transfer of the substrate stack 300 to the lift 200 has been completed, the load lock cavity 130 may be sealed and the load lock interior volume evacuated such that the pressure in the load lock 100 approaches that of the vacuum chamber. Each substrate from the substrate stack 300 may then be individually picked by the vacuum robot and transported from the cavity 130, through the second opening 120, to the vacuum chamber where one or more processing steps can be performed on the picked substrate.

As previously noted, the lift 200 may be configured to adjust the pitch between adjacent substrates. Thus, the lift may be configured to move one or more of the substrates of the substrate stack 300 vertically up or down along the direction indicated by arrow 400 such that an individual substrate of the substrate stack 300 is aligned with the opening 120. An end effector 460 (FIG. 4C) of the vacuum robot may then be inserted into the cavity 130 and the individual substrate can be picked. As previously noted, due to increasing size and weight of the substrates that may be handled using the disclosed lift 200, the vacuum robot may suffer from substantial droop. Thus, to allow the vacuum robot to retrieve individual substrates from the stack 300 without inadvertently engaging adjacent substrates, the lift 200 may be operable to increase the pitch between the substrate being retrieved and an adjacent substrate positioned immediately below. The cavity 130 is sized such that the lift 200 may move the substrate stack 300 vertically up or down (along the direction of arrow 400) to allow the vacuum robot to pick each of the substrates in the substrate stack through the second opening 120.

Figure 2:
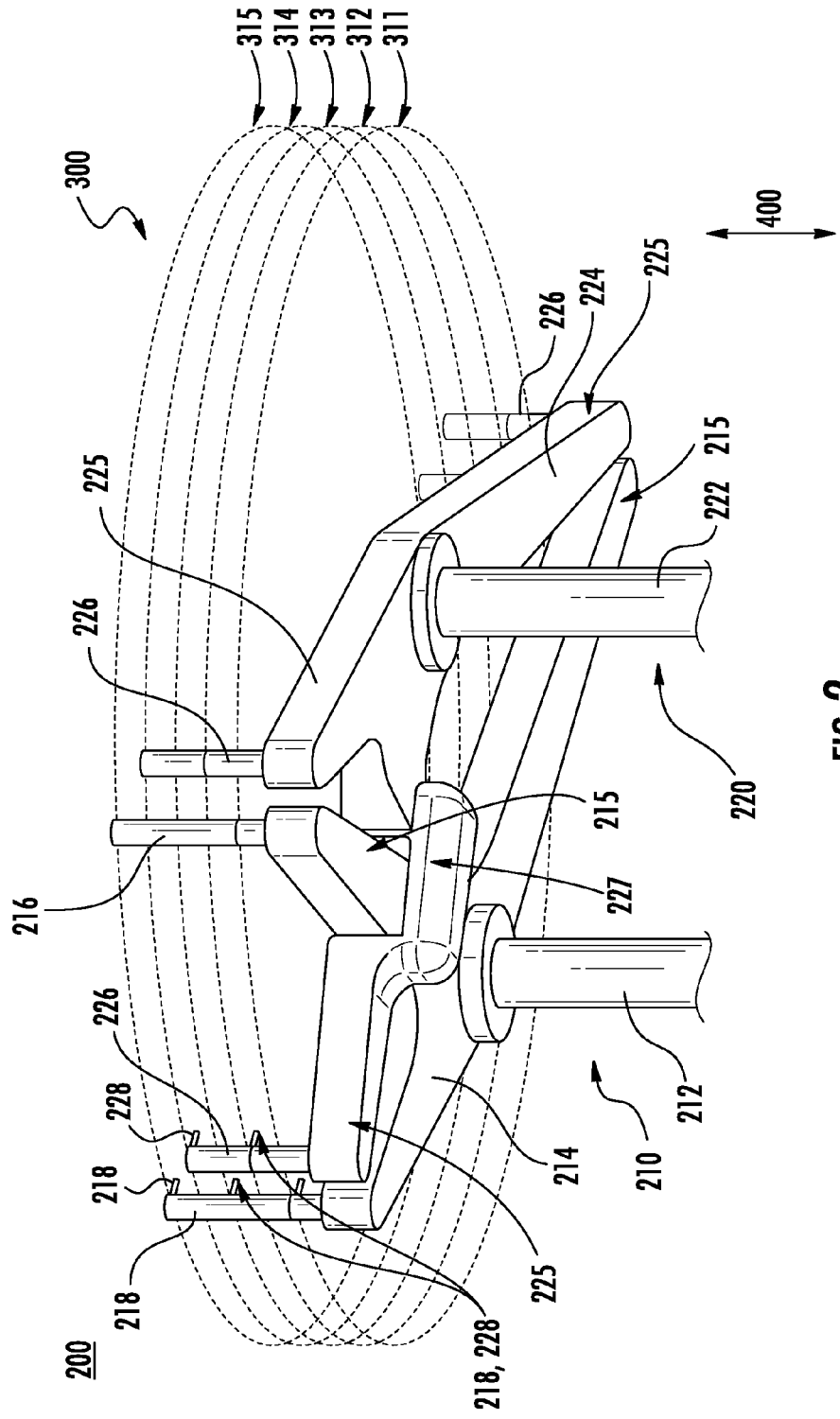
FIG. 2 is an isometric view of the dynamic pitch substrate lift of FIG. 1.

FIG. 2 shows the lift 200 in greater detail. The lift 200 may include a first lift portion 210 and a second lift portion 220. The first and second lift portions 210 and 220 include first and second shafts 212, 222, respectively. The first and second lift portions also include first and second lateral support arms 214, 224, attached to respective first and second shafts 212, 222. The first and second shafts 212 and 222 may be controllably movable in order to move the first and second lift portions 210, 220 vertically up or down (along the direction of arrow 400). As will be described in greater detail below, the first and second lift portions 210, 220 may be moved independently of each other. Furthermore, as the first and second lift portions 210, 220 may be moved up or down (along the direction of arrow 400), parallel to the longitudinal axes of the first and second shafts 212, 222. In particular, as the first and second shafts 212 and 222 may be moved along their longitudinal axes, respective first and second lateral support arms 214 and 224 may be correspondingly moved. Because the first and second lateral support arms 214, 224 engage individual substrates in the substrate stack 300, the substrates are moved up or down (along the direction of arrow 400) as the associated first or second shaft 212, 222 move up and down.

In various examples, the first and second lift portions 210 and 220 may be moved up or down (along the direction of arrow 400) to raise or lower the substrates 311-315 in the cavity 130. More specifically, one or both of the first and second lift portions 210 and 220 may be moved up or down (along the direction of arrow 400) together in order to align one of the substrates in the substrate stack 300 with the second opening 120. Furthermore, the first and second lift portions 210 and 220 may be moved independently of each other in order to dynamically adjust the pitch between adjacent substrates in the substrate stack 300.

The first and second lateral support arms 214, 224 may be configured to support every other substrate in the substrate stack 300. More specifically, the first lateral support arm 214 may be configured to support substrates 311, 313, and 315, while the second lateral support arm 224 may be configured to support substrates 312 and 314. As such, a single lateral support arm supports every other substrate. In this way, every other substrate in the substrate stack 300 may be moved up or down (along the direction of arrow 400) independently of the adjacent substrates in the substrate stack.

To engage the individual substrates, the first and second lateral support arms 214, 224 include a plurality of first and second substrate support towers 216, 226, respectively. The first and second substrate support towers 216, 226 may extend vertically from respective distal ends 215, 225 of the first and second lateral support arms 214, 224. The plurality of first and second substrate support towers 216, 226 can include a plurality of first and second laterally extending tines 218, 228, respectively, upon which the substrates in the stack 300 may be supported along a peripheral portion thereof.

The illustrated configuration of the first and second substrate support towers 216, 226 and first and second lateral support arms 214, 224 is merely an exemplary implementation, and is not intended to be limiting. For example, in the illustrated embodiment the first and second lateral support arms 214, 224 each include three distal ends 215, 225, though this is not critical and greater or fewer distal ends can be provided, as desired. In addition, the second lateral support arm includes a U-shaped cutout 227 so that the first and second lateral support arms 214, 224 can cross each other in order to appropriately support different alternating substrates. It is contemplated that a variety of alternative physical configurations for the first and second lateral support arms can be employed without departing from the scope of the present disclosure.

Figure 3:
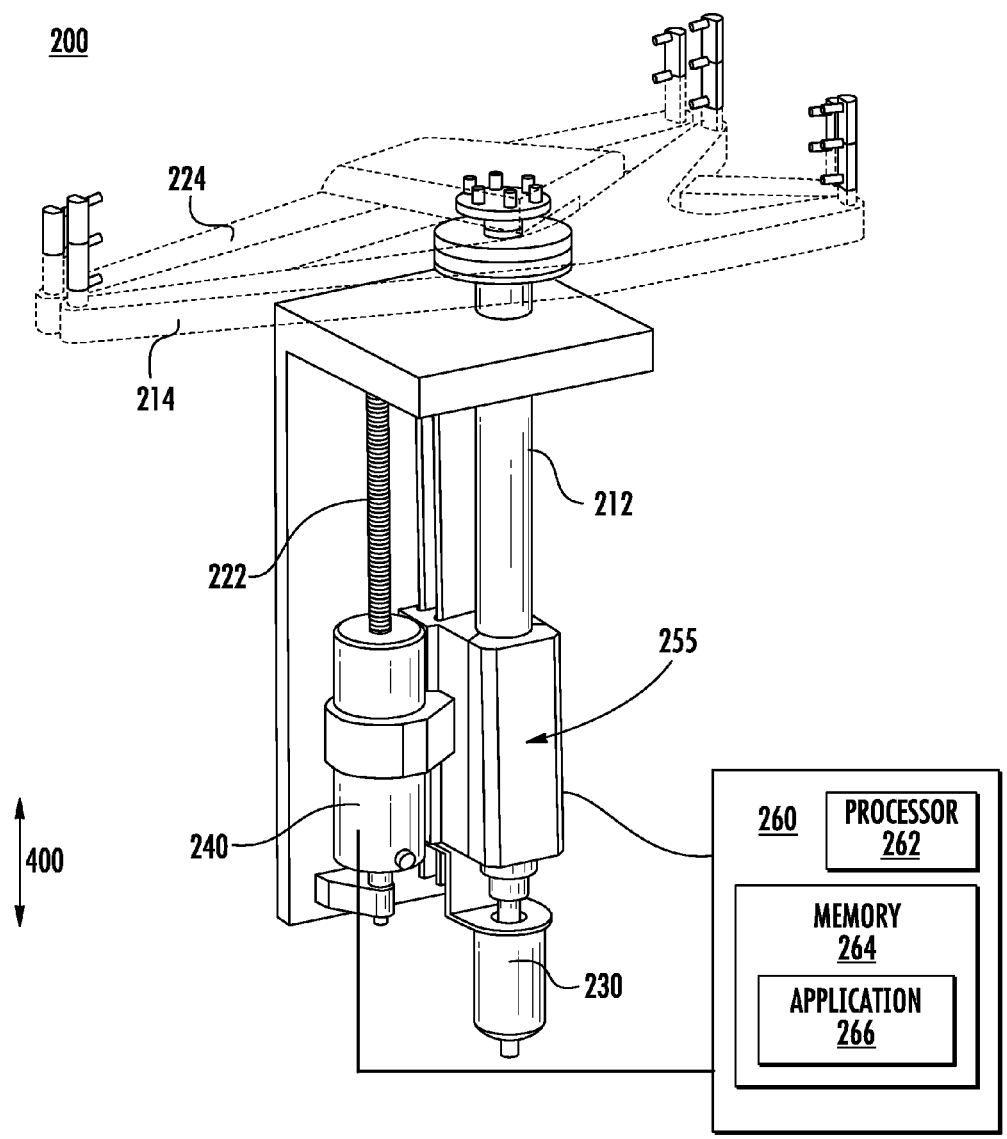
FIG. 3 is a further isometric view of the dynamic pitch substrate lift of FIG. 1.

FIG. 3 shows the lift 200 separate from the previously described substrates. In this view the first and second lift portions 210, 220, first and second shafts 212, 222, and the first and second lateral support arms 214, 224 can be seen. Furthermore, first and second actuators 230, 240 are also shown as being associated with the first and second shafts 212, 222, respectively. The first actuator 230 (e.g., a motor, a servo, a gear, or the like,) is configured to move the first shaft 212 up or down (along the direction of arrow 400). Likewise, the second actuator 240 (e.g., a motor, a servo, a gear, or the like,) is configured to move the second shaft 222 up or down (along the direction of arrow 400).

The first and second actuators 230, 240 are coupled to a mounting bracket 250 that itself is coupled to the load lock 100. The mounting bracket 250 includes a coupling that supports the first and second actuators 230, 240. As depicted, the second actuator 240 may be coupled to the first shaft 212 via clamp 255 configured to attach the second actuator 240 the first shaft 212 so that second actuator 240 may "ride along" or move in conjunction with the movement of the shaft 212. Accordingly, when the shaft 212 is moved along the direction of arrow 400, the shaft 222 may also be moved in that direction. The second actuator 240 is further configured to move the second shaft 222 independently of the first shaft 212. Thus arranged, the second shaft 224 may be moved by a different amount, and/or in a different direction, from the first shaft 212.

The lift 200 may also include a controller 260 for controlling the movements of the lift 200 as described herein. The controller 260 may include a processor 262 (e.g., microprocessor, central processing unit, or the like) configured to execute instructions for controlling the movements of the first and second shafts 212 and 214. More specifically, the controller 260 may be configured to control the first and second actuators 230, 240 such that the lift 200 can adjusts the pitch between selected substrates, thus facilitating the transfer of substrates into and out of the load lock 100.

The controller 260 may also include a memory 264 for storing a control application 266, which when executed by the processor 262 causes the lift 200 to be operated as described herein. In one non-limiting exemplary embodiment the memory is a non-transient memory. Further non-limiting examples include EEPROM, SSD, EPROM, ROM, hard disk drive or the like.

In operation, a substrate stack 300 may be introduced into the cavity 130 by an atmospheric robot (not shown). Specifically, the substrates of the substrate stack 300 may be inserted one at a time, in groups, or all at once through the first opening 110 and into the cavity 130. Once in the cavity 130, the substrates may be positioned between the first and second support towers 216, 226, above respective first and second tines 218, 228. The controller 260 may then activate the lift 200 to move the first and second support towers 216, 226 up (along the direction of arrow 400) such that the tines 218 and 228 engage the underside of the associated substrate(s) and to lift the substrate(s) up and away from the atmospheric robot. During this operation the first and second shafts 212, 222 may move together.

The cavity 130 then may be sealed and pumped down. The lift 200 may be moved up or down (along the direction of arrow 400) to align a targeted substrate within the stack 300 with the second opening 120. More specifically, the shafts 214 and 212 may be moved (e.g., by activating the first actuator 230) such that the targeted substrate is aligned with the second opening 120. The pitch between the targeted substrate and an adjacent substrate (e.g., the substrate below the targeted substrate) may be adjusted (see FIGS. 4A-4F) to provide a desired clearance for inserting an end effector of the vacuum robot. For example, the pitch may be increased (i.e., the spacing between the targeted substrate and the next adjacent substrate below the targeted substrate may be increased) in order to accommodate the droop of the vacuum robot arm. Once the end effector of the vacuum robot is positioned beneath the targeted substrate, the lift 200 may be moved downward (along the direction of arrow 400) to transfer support of the substrate from the tines (e.g., 218 or 228) to the vacuum robot end effector. The end effector may then remove the targeted substrate from the stack and transfer it to the processing chamber.

In general, the pitch between adjacent substrates may be adjusted by moving the first and second shafts 212, 222 up or down with respect to each other along the direction of arrow 400. This can be done by moving one of the first and second shafts 212, 222 and leaving the other shaft stationary. Alternatively, the first and second shafts 212, 222 can be moved in opposite directions. Because the first and second shafts 212, 222 are coupled to different substrates, the relative movement of the first and second shafts will cause corresponding relative movement of the substrates.

The targeted substrate may be returned to the cavity 130 by the vacuum robot simply by reversing the above process (refer to FIGS. 4A-4F). Another substrate may then be selected and transferred as described above. It will be appreciated that the substrates of the stack can be picked from and returned to the lift 200 in sequence, or multiple substrates can be picked prior to returning any substrates to the lift.

FIGS. 4A-4F are block diagrams illustrating example movements of the support arms, and consequently, substrates in a substrate stack. A lift 405 includes a first lift portion 410 and a second lift portion 420. It will be appreciated that lift 405, including the first and second lift portions 410, 420 may include some or all of the features and functionalities of the lift 100 and first and second lift portions 210, 220 described in relation to FIGS. 1-3.

Each of the first and second lift portions 410, 420 are illustrated supporting two substrates of a four-substrate stack 430. More specifically, the first lift portion 410 is shown supporting substrates 431 and 433 while the second lift portion 420 is shown supporting substrates 432 and 434. As depicted, the substrates 431-434 are supported on tines 418, 428 of the respective first and second lift portions 410, 420. In general, FIGS. 4A-4F depict the process of dynamically adjusting the pitch between substrates 432 and 433 for purposes of picking substrate 432 and transferring it to a processing chamber. It will be appreciated, however, the sequence and operations described may be performed to dynamically adjust the pitch between any two substrates for removal and/or reinsertion of a substrate from the lift 400.

Referring to FIG. 4A, substrates 431-434 are supported by either the first lift portion 410 or the second lift portion 420. Pitches between substrates are also shown. Namely, pitch 451 is shown as the gap between substrates 431 and 432, pitch 452 is shown as the gap between substrates 432 and 433, and pitch 453 is shown as the gap between substrates 433 and 434. As can be seen in FIG. 4A, the pitches 451-453 are substantially the same. The substrate stack may be referred to as being in a first state when the pitches between adjacent substrates are substantially the same. In some embodiments, the first state may correspond to the state of the lift 405 when it receives substrates from the atmospheric load lock. In some exemplary non-limiting embodiments, the pitch between adjacent substrates in the stack may be approximately 12 mm in the first state.

Turning now to FIG. 4B, in preparation for removal of substrate 432 (FIG. 4A) from the stack, pitch 452 may be increased by moving the second lift portion 420 up (along the direction of arrow 400) while maintaining the first lift portion 410 stationary. As depicted, after the second lift portion 420 is moved upward, the pitches 451 and 453 are reduced, while pitch 452 is increased. The result is that more space is provided between substrates 432 and 433 to receive the end effector 460 (FIG. 4C) of the vacuum robot. In this position the substrate stack may be referred to as being in a second state when the pitch between two of the substrates in the stack is increased. In some examples, a pitch between two substrates (e.g., the pitch 452) may be increased by approximately 7 mm to result in a total pitch of approximately 18 mm in the second state. In the illustrated embodiment, dynamically increasing the pitch by approximately 7 mm leaves the remaining pitches at approximately 4 mm with a 2 mm gap between the top of the substrates and the undersides of the tines directly above the substrates. More particularly, in some embodiments, the substrates 431-434 may be 1 mm thick, while the tines are 2 mm thick. As such, by moving the lift 420 up by 7 mm, one of the pitches will be increased to 18 mm while the other pitches will be reduced to 4 mm. It will be appreciated that these dimensions are not critical, and that other pitch values in the first and second states can also be used.

Turning now to FIG. 4C, an end effector 460 of a vacuum robot (not shown) may be inserted between substrates 432 and 433 when the substrate stack is in the second state. In FIG. 4D, the second lifting portion 420 is moved downward (along the direction of arrow 400) to reduce the pitch 452 between substrates 432 and 433 so that substrate 432 is dropped down into engagement with the end effector 460. In some embodiments, the end effector 460 may engage the substrate 432 when the substrate stack is returned to the first state. As shown in FIG. 4E, the second lifting portion 420 has been moved downward (along the direction of arrow 400) such that support of the substrate 432 is transferred from the tines 428 of the second lifting portion to the end effector 460. The substrate stack may be referred to as being in a third state when support of one of the substrates in the stack is transferred to the end effector 460. Turning now to FIG. 4F, substrate 432 has been removed from the lift 405.

It will be appreciated that the actual movement of the second lifting portion 420 to place the substrate stack in the third position may be dependent upon which substrate is being supported by the end effector 460, as well as the distance between the support tines 418, 428 for the targeted substrate and the substrate located immediately below the targeted substrate. In addition, although the previous description described movement of the second lifting portion 420 to effect removal of substrate 432, it will be appreciated that the first lifting portion 410 may be moved (again, along the direction of arrow 400) to facilitate removal of a substrate supported by the first tines 418 (e.g., substrate 431 or substrate 433). In addition, although the process has been described in relation to one lifting portion moving while another lifting portion remains stationary, it is also contemplated that a desired pitch adjustment may be obtain by moving both the first and second lifting portions 410, 420 in opposite directions. It will also be appreciated that a similar, but reversed, process can be used to return a substrate to the lift 405.

As stated above, the examples of dynamically adjusting the pitch between two substrates in a stack may be generalized to apply to the other substrates in the stack not depicted in the examples. More specifically, the pitch between any substrate in stack may be dynamically adjusted by moving one of the first or second lifting portions such that the substrates in the stack supported by the moved lift are moved. As such, an end effector may be used to access any of the substrates in a stack, even where the pitch between the substrates (while in the first state) may be too small to accommodate the end effector without causing unwanted contact between the end effector and a substrate.

Figure 5:
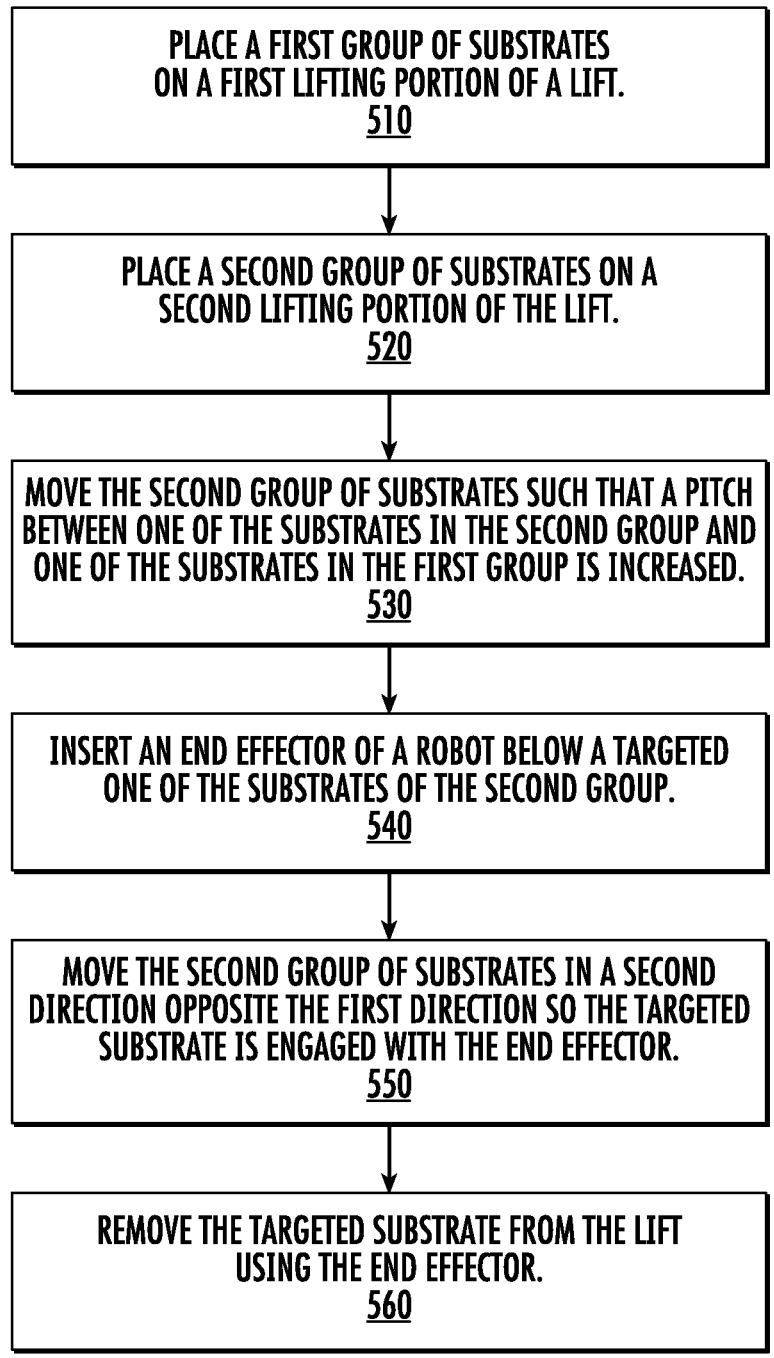
FIG. 5 depicts one embodiment of a method for dynamically adjusting the pitch between substrates in a substrate stack.

FIG. 5 is a flow diagram of a method 500 for dynamically adjusting a substrate pitch according to an embodiment of the present disclosure. The method 500 is described with respect to the lift 200 depicted in FIGS. 1-3. However, it is to be appreciated, that the method 500 may be practiced using other lifts having independently moveable lifting portions.

At step 510, a first group of substrates from a substrate stack 300 may be placed on a first lifting portion of a lift 200. At step 520, a second group of substrates from the substrate stack 300 may be placed on a second lifting portion of the lift 200. The first group of substrates may be interleaved with the second groups of substrates on the lift 200 so that substrates of said first group of substrates are alternatingly supported adjacent to substrates of said second group of substrates.

At step 530, the second group of substrates are moved in a first direction such that a pitch between one of the substrates in the second group and one of the substrates in the first group is increased. In one embodiment, the second lifting portion may move in the first direction such that the second group of substrates is moved while the first group of substrates remains stationary. Specifically, one of the substrates in the first group may be moved further away from one of the substrates in the second group such that the pitch between the two substrates in increased. At step 540 an end effector of a robot may be inserted below a targeted one of the substrates of the second group. At step 550, the second group of substrates may be moved in a second direction opposite to that of the first direction so that the targeted substrate is engaged with the end effector. At step 560, the end effector removes the targeted substrate from the lift.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A dynamic pitch substrate lift between substrates in a stack, comprising:
    a first lift portion for supporting a first group of a plurality of substrates arranged in a stack, and for moving the first group of substrates in a first direction; and a second lift portion for supporting a second group of the plurality of substrates, and for moving the second group of substrates in the first direction independent of the first group of substrates, the first lift portion comprising a first lateral support arm having first vertically oriented substrate support towers disposed at opposite distal ends of the first lift portion, each of the first vertically oriented substrate support towers including a plurality of first laterally extending tines for supporting the first group substrates along a peripheral portion thereof; and the second lift portion comprising a second lateral support arm having second vertically oriented substrate support towers disposed at opposite distal ends of the second lift portion, each of the second vertically oriented substrate support towers including a plurality of second laterally extending tines for supporting the second group of substrates along a peripheral portion thereof;

wherein the first and second lift portions are configured to support the first and second groups of the plurality of substrates such that alternating substrates in the stack are supported by the first lift portion.

2. The dynamic pitch substrate lift of claim 1, the first and second lift portions each including a shaft connected to an actuator, the actuator configured to move the shaft in the first direction.

3. The dynamic pitch substrate lift of claim 2, wherein the shaft of the second lift is coupled to the shaft of the first lift such that movement of the shaft of the first lift causes a corresponding movement in the shaft of the second lift.

4. The dynamic pitch substrate lift of claim 3, wherein the first and second lateral support arms are coupled to the first and second shafts, respectively.

5. The dynamic pitch substrate lift of claim 4, wherein each of the plurality of supporting tines comprises a planar support surface oriented perpendicular to an associated one of the first and second pluralities of vertically oriented substrate support towers.

6. The dynamic pitch substrate lift of claim 1, wherein the first and second lift portions are configured to move in unison in the first direction.

7. The dynamic pitch substrate lift of claim 1, wherein moving the first lift portion with respect to the second lift portion adjusts a distance between adjacent ones of said plurality of substrates.

8. A load lock for storing substrates to be processed, the load lock comprising:
a first opening for receiving a substrate stack including a plurality of substrates;
a second opening for retrieving a substrate of the plurality of substrates; and
a dynamic pitch substrate lift comprising:
a first lift portion for supporting a first group of the plurality of substrates and to move the first group of substrates in a first direction; and
a second lift portion to support a second group of the plurality of substrates and to move the second group of substrates in the first direction independent of the first group of substrates, the first and second groups of substrates each including at least one of the plurality of substrates wherein the ones of the plurality of substrates in each of the first and second groups alternate,
the first lift portion comprising a first lateral support arm having first vertically oriented substrate support towers disposed at opposite distal ends of the first lift portion, each of the first vertically oriented substrate support towers including a plurality of first laterally extending tines for supporting the first group substrates along a peripheral portion thereof; and the second lift portion comprising a second lateral support arm having second vertically oriented substrate support towers disposed at opposite distal ends of the second lift portion, each of the second vertically oriented substrate support towers including a plurality of second laterally extending tines for supporting the second group of substrates along a peripheral portion thereof;

wherein moving the first lift portion in the first direction adjusts a distance between adjacent ones of said plurality of substrates.

9. The load lock of claim 8, the first and second lift portions each including a shaft connected to an actuator, the actuator configured to move the shaft in the first direction.

10. The load lock of claim 9, wherein the shaft of the second lift is coupled to the shaft of the first lift such that movement of the shaft of the first lift causes a corresponding movement in the shaft of the second lift.

11. The load lock of claim 10, the first and second lateral support arms coupled to the first and second shafts, respectively.

12. The load lock of claim 8, wherein each of the plurality of supporting tines comprises a planar support surface oriented perpendicular to an associated one of the first and second pluralities of vertically oriented substrate support towers.

13. The load lock of claim 8, wherein the first and second lift portions are configured to move in unison in the first direction.

14. The load lock of claim 8, wherein moving the first lift portion with respect to the second lift portion adjusts a distance between adjacent ones of said plurality of substrates.

15. A method of dynamically adjusting the pitch between substrates in a substrate stack, the method comprising:
supporting a first group of a plurality of substrates on a first lift portion;
supporting a second group of the plurality of substrates on a second lift portion;
the first lift portion comprising a first lateral support arm having first vertically oriented substrate support towers disposed at opposite distal ends of the first lift portion, each of the first vertically oriented substrate support towers including a plurality of first laterally extending tines for supporting the first group substrates along a peripheral portion thereof;
the second lift portion comprising a second lateral support arm having second vertically oriented substrate support towers disposed at opposite distal ends of the second lift portion, each of the second vertically oriented substrate support towers including a plurality of second laterally extending tines for supporting the second group of substrates along a peripheral portion thereof; and
moving the second group of substrates in a first direction independent of the first group of substrates such that a pitch between one of the substrates in the second group and one of the substrates in the first group is changed.

16. The method of claim 15, wherein the plurality of substrates comprises a substrate stack, the first group of substrates including every other one of the plurality of substrates and the second group of substrates includes the ones of the plurality of substrates not included in the first group of substrates.

17. The method of claim 15, further comprising moving the second group of substrates in the first direction such that a pitch between adjacent substrates is reduced.

18. The method of claim 17, further comprising picking one of the plurality of substrates with an end effector of a robot.

* * * * *